(12) United States Patent
Marty et al.

(10) Patent No.: US 9,299,865 B2
(45) Date of Patent: Mar. 29, 2016

(54) SPAD PHOTODIODE OF HIGH QUANTUM EFFICIENCY

(71) Applicants: STMicroelectronics (Crolles 2) SAS, Crolles (FR); STMicroelectronics SA, Montrouge (FR); Commissariat A L'Energie Atomique et aux Energies Alternatives, Paris (FR)

(72) Inventors: Michel Marty, Saint Paul d Varces (FR); Laurent Frey, Grenoble (FR); Sebastien Jouan, Crolles (FR); Salim Boutami, Grenoble (FR)

(73) Assignees: STMicroelectronics (Crolles 2) SAS; STMicroelectronics SA, Crolles, Montrouge (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/464,898

(22) Filed: Aug. 21, 2014

(65) Prior Publication Data
US 2015/0053924 A1    Feb. 26, 2015

(30) Foreign Application Priority Data

Aug. 23, 2013 (EP) ..................................... 1358139

(51) Int. Cl.
*H01L 29/06* (2006.01)
*H01L 31/062* (2012.01)
*H01L 27/14* (2006.01)
*H01L 31/107* (2006.01)
(Continued)

(52) U.S. Cl.
CPC ........ *H01L 31/035236* (2013.01); *G01T 1/248* (2013.01); *H01L 27/14625* (2013.01);
(Continued)

(58) Field of Classification Search
CPC .................. H01L 31/035236; H01L 27/14625; H01L 31/02327; H01L 21/14643; H01L 27/14614; H01L 27/1443; H01L 27/1463; H01L 27/146; H01L 27/14621; H01L 27/14632; H01L 27/14685; H01L 31/105
USPC ............ 257/21, 432, 291, 431, 232, E27.133, 257/E31.001, 438; 438/94, 69, 71
See application file for complete search history.

(56) References Cited

U.S. PATENT DOCUMENTS

| 5,656,835 A | 8/1997 | Komobuchi | |
| 2006/0006485 A1* | 1/2006 | Mouli | 257/432 |

(Continued)

FOREIGN PATENT DOCUMENTS

| EP | 2144303 A1 | 1/2010 |
| EP | 2477231 A2 | 7/2012 |

(Continued)

OTHER PUBLICATIONS

INPI Search Report and Written Opinion for FR 1358139 mailed Jun. 20, 2014 (7 pages).

*Primary Examiner* — Long K Tran
*Assistant Examiner* — Dzung Tran
(74) *Attorney, Agent, or Firm* — Gardere Wynne Sewell LLP (57) ABSTRACT

A SPAD-type photodiode has a semiconductor substrate with a light-receiving surface. A lattice formed of interlaced strips made of a first material covers the light receiving surface. The lattice includes lattice openings with lateral walls covered by a spacer made of a second material. Then first and second materials have different optical indices, and further each optical index is less than or equal to the substrate optical index. A pitch of the lattice is of the order of a magnitude of an operating wavelength of the photodiode. The first and second materials are transparent at that operating wavelength. The lattice is made of a conductive material electrically coupled to an electrical connection node (for example, a bias voltage node).

20 Claims, 6 Drawing Sheets

(51) Int. Cl.
*H01L 31/0352* (2006.01)
*G01T 1/24* (2006.01)
*H01L 31/0232* (2014.01)
*H01L 27/146* (2006.01)

(52) U.S. Cl.
CPC .... *H01L27/14643* (2013.01); *H01L 27/14689* (2013.01); *H01L 31/02327* (2013.01); *H01L 31/107* (2013.01)

(56) References Cited

U.S. PATENT DOCUMENTS

| | | |
|---|---|---|
| 2006/0012001 A1 | 1/2006 | Kim |
| 2008/0121781 A1* | 5/2008 | Boettiger .................. 250/208.1 |
| 2008/0170143 A1 | 7/2008 | Yoshida |
| 2009/0020690 A1* | 1/2009 | Toda .......................... 250/227.2 |
| 2010/0122221 A1* | 5/2010 | Fertig et al. ....................... 716/2 |
| 2011/0108939 A1* | 5/2011 | Marty et al. ................. 257/432 |
| 2011/0220976 A1 | 9/2011 | Iida et al. |
| 2011/0290982 A1* | 12/2011 | Boutami et al. ........... 250/208.1 |
| 2012/0267694 A1 | 10/2012 | Kaiser et al. |
| 2013/0082286 A1 | 4/2013 | Finkelstein et al. |

FOREIGN PATENT DOCUMENTS

| | | |
|---|---|---|
| KR | 20020045162 A | 6/2002 |
| WO | WO-2012032495 A1 | 3/2012 |

\* cited by examiner

Fig 1

(PRIOR ART)

Fig 2

(PRIOR ART)

SPAD PHOTODIODE OF HIGH QUANTUM EFFICIENCY

PRIORITY CLAIM

This application claims the priority benefit of French Patent application number 1358139, filed on Aug. 23, 2013, the contents of which is hereby incorporated by reference in its entirety to the maximum extent allowable by law.

TECHNICAL FIELD

The present disclosure relates to light-receiving diodes or semiconductor photodiodes, for example used as single-photon photodiodes.

BACKGROUND

Figure 1:
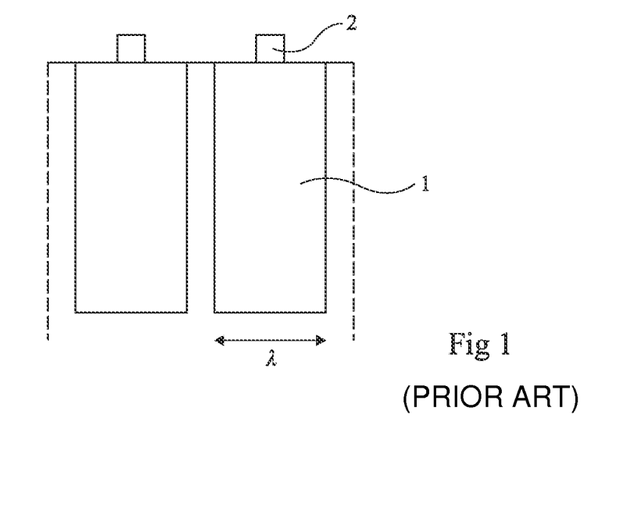
FIG. 1 very schematically shows, in cross-section view, a portion of two small photodiodes.

FIG. 1 partially and schematically shows two photodiodes side by side of an array of photodiodes for example forming an image sensor. Each photodiode comprises a semiconductor area 1 converting photons into electron-hole pairs. A complete photodiode comprises junctions (not shown) between semiconductor regions of opposite type to store electrons/holes, and various transistors for transferring the electrons/holes.

PCT patent application WO2012/032495 (incorporated by reference) discloses that the introduction of light into the photodiode raises an issue when the lateral dimensions of the illuminated surface (the upper surface in FIG. 1) of a photodiode are very small, in the order of wavelength λ of the light that the photodiode is intended to capture. Thus, the quantum efficiency of such photodiodes of very small dimensions is low. This PCT patent application provides, to increase the quantum efficiency of the photodiode, to arrange on the upper surface thereof a pad 2 having lateral dimensions much smaller than the lateral dimensions of the photodiode.

Figure 2:
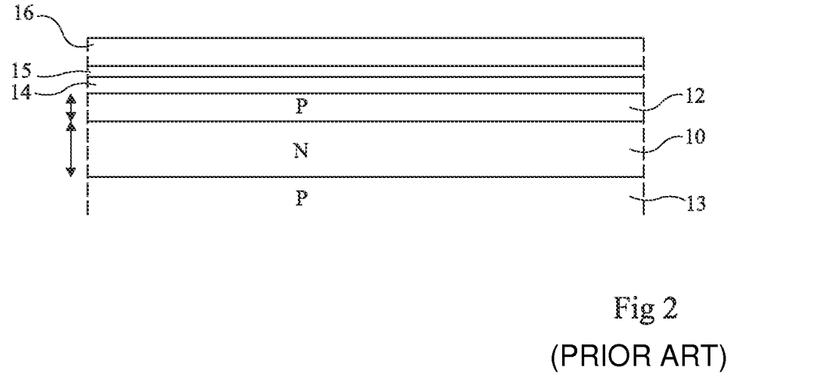
FIG. 2 very schematically shows, in cross-section view, a portion of a SPAD-type photodiode.

FIG. 2 partially and schematically shows the detection portion of a single-photon avalanche diode, currently called SPAD. Such a diode comprises a structure formed of an N-type semiconductor layer 10 sandwiched between two semiconductor layers 12 and 13 of opposite type. The problem is that layer 10 is, in modern technologies, very thin, with a thickness not exceeding from 1 to 1.5 μm. This layer 10 is the place where the useful conversion of photons into electron-hole pairs is to be performed, while it is known that, in the case of silicon and for an infrared radiation, the layer where the electron-hole pairs are to be created should have a thickness greater than 10 μm, to expect a photon conversion rate greater than 90%. Thus, the efficiency of a SPAD diode manufactured with current technologies does not exceed from 5 to 7%. To improve this efficiency and to avoid losing reflected light, upper semiconductor layer 12 has an antireflection structure, alternately comprising at least one layer of material of low index 14, for example, silicon oxide, and one layer of material of higher index 15, for example, silicon nitride, arranged thereon. Upper protection layer 16 currently is a silicon oxide layer.

Thus, a problem arises to absorb the maximum possible number of photons in structures with pixels of small dimensions such as shown in FIG. 1, and in structures where the layer of conversion of photons into electron-hole pairs is particularly thin, such as the SPAD structure of FIG. 2. More generally, this problem arises more or less in all semiconductor photodiodes.

It should be noted that in SPAD-type photodiodes, an increase, even low, of the quantum efficiency or absorption rate of the useful portion of the photodiode is in practice extremely important for the detection of low-intensity light. Thus, an efficiency gain from 1 to 5% will be considered as a very significant gain by the user.

Further, like all photodiodes, SPAD-type photodiodes have a dark current which is desired to be decreased as much as possible, in the absence of illumination.

SUMMARY

Thus, an embodiment provides a SPAD-type photodiode having its light-receiving surface covered with interlaced strips forming a lattice of a first material having its lateral walls surrounded with at least on spacer made of at least one second material having an optical index different from the first material, the pitch of the lattice being of the order of magnitude of the operating wavelength of the photodiode, the first and second materials being transparent to the operating wavelength, the first material being conductive and being coupled to a connection node.

According to an embodiment, the first material has an index n1 different from index n2 of the second material, each of indexes n1 and n2 being smaller than or equal to index $n_{sc}$ of the semiconductor forming the photodiode.

According to an embodiment, the photodiode is coated with a protection layer made of a material of index n3 lower than n1 and n2.

According to an embodiment, each of the strips of the lattice has a width in the range between one tenth and one third of the operating wavelength of the photodiode.

According to an embodiment, the photodiode is based on silicon, and the strips of the first material are made of doped polysilicon and are bordered with silicon nitride spacers.

According to an embodiment, the protection layer is made of silicon oxide.

An embodiment provides a method of manufacturing a photodiode such as hereabove, comprising a prior simulation step to determine according to the selected materials and to the operating wavelength the dimensions and the pitch of the lattice strips.

According to an embodiment, the steps of manufacturing the strips and the spacers are carried out at the same time as MOS transistor gate manufacturing steps.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

For clarity, the same elements have been designated with the same reference numerals in the various drawings and, further, as usual in the representation of integrated circuits, the various drawings are not to scale.

In the case of a SPAD-type diode, having lateral dimensions currently in the range from 5 to 20 µm, it could be devised to form an array of single-material pads of the type of the single pad described in relation with FIG. 1. To further improve the quantum efficiency, a structure where each pad comprises a coated central pad surrounded with a spacer could also be formed.

Figure 3A:
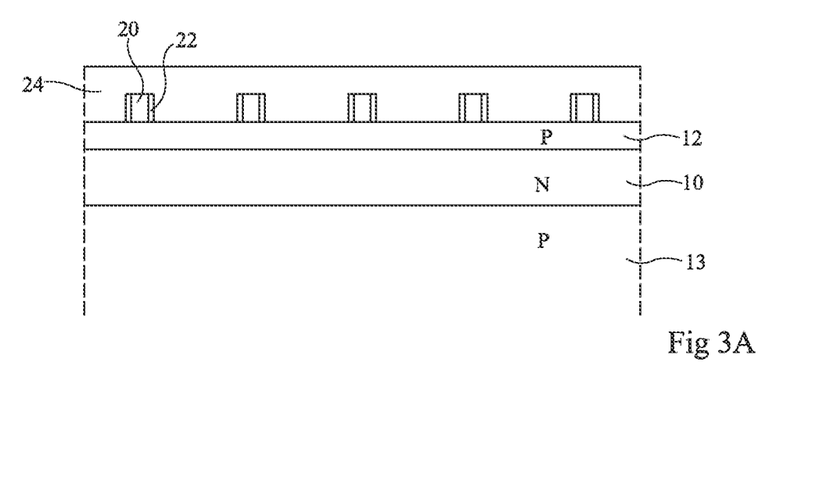
FIG. 3A very schematically shows, in cross-section view, an example of a SPAD-type photodiode.

FIG. 3A is a cross-section view of a SPAD diode of the same type as that in FIG. 2, comprising, like said diode, a layer 10 transforming photons into electron-hole pairs of a first conductivity type, for example, type N, surrounded by two layers 12 and 13 of the opposite conductivity type. The structure is covered with an array of pads, each of which comprises a central portion 20 surrounded with a spacer 22. The upper surface is entirely covered with an insulating protection layer 24 which is currently topped with a filtering layer and with a lens specific to each pixel (not shown).

The central portion 20 is made of a first material of index n1 different from index n2 of the spacer material. Layer 24 is made of a material of index n3 lower than n1 and n2. The materials of central pad 20 and of layers 22 and 24 are transparent to the operating wavelength of the photodiode. Each of indexes n1 and n2 is lower than index $n_{sc}$ of semiconductor 1, but one of the two may however be equal to $n_{sc}$. As an example, in the case where semiconductor 1 is silicon and has an 850-nm operating wavelength, material 20 may be polysilicon of index n1=3.6 and material n2 may be silicon nitride, stoichiometric or not, SiN, of index n2=2. Pad 20 has lateral dimensions much smaller than the wavelength, for example, in the range between one tenth and one third of the wavelength to be detected, or operating wavelength, and lateral layer or spacer 22 has an average width in the range from 20 to 60 nm. This pad may have any shape, for example round, square, oval, or rectangular.

It can be observed, as will be discussed hereafter, that such a structure, properly sized, increases by a few percent the quantity of photon conversion into electron-hole pairs in semiconductor region 10. This is imputed to the fact that the presence of central pad 20, made of a material transparent to the considered light, generates, on the one hand, diffraction effects and that such diffraction effects are enhanced by the presence of spacer 22 and/or, on the other hand, an antireflection effect which also improves with the presence of spacer 22. Some of the photons then move obliquely, and no longer vertically, in the semiconductor, which increases their probability of being absorbed in layer 10.

Figure 3B:
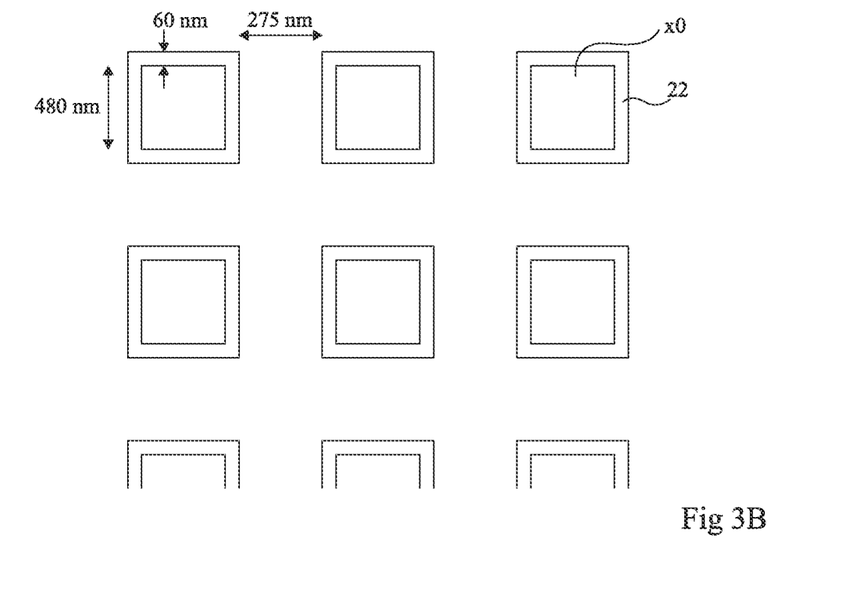
FIG. 3B is an enlarged top view of a portion of FIG. 3A.

FIG. 3B is a top view of an embodiment. In the case where the semiconductor is silicon and where the radiation that the photodiode is intended to accept has a wavelength λ, the pitch of the pads may be equal to 2λ/3 to within 20%, the lateral dimensions of the pads may be in the range between one tenth and one third of the wavelength and the distance between pads may be in the range from one quarter to two thirds of the wavelength. In the shown example where the pads are made of polysilicon, the spacers are made of silicon nitride, and the operating wavelength is 850 nm, one may select, as an example:

lateral dimensions of the pads of 400 nm,
distances between pads of 150 nm,
spacer widths of 40 nm, and
pad and spacer widths of 180 nm.

Figure 4A:
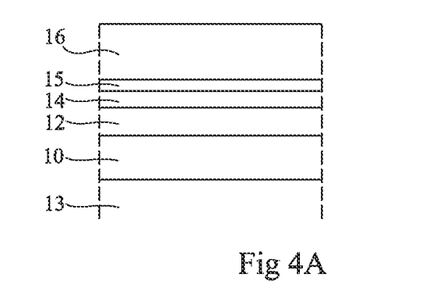
FIGS. 4A, 4B, and 4C are simplified cross-section views of a portion of the upper region of photodiodes of different types.
Figure 4B:
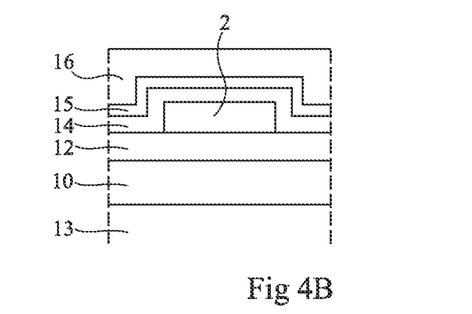
Figure 4C:
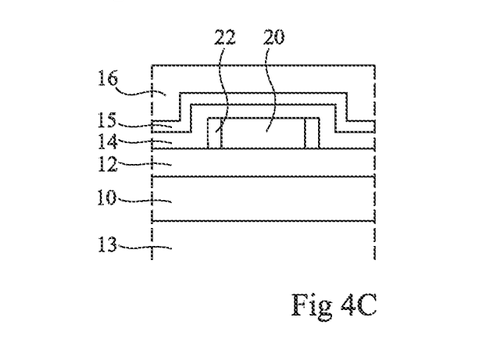

FIGS. 4A, 4B, 4C show, for comparison, respectively, a pattern of a pad-less structure, of a structure with single-material pads, and of a structure with pads and spacers. In FIG. 4A, the structure is covered with no pad but only with an antireflection layer, designated with the same reference numerals as in FIG. 2. In FIG. 4B, the structure is coated with single-material pads 2 such as that in FIG. 1 and is provided with an antireflection coating. In FIG. 4C, the structure is provided with pads 20 surrounded with spacers 22 and is also provided with an antireflection coating.

Comparative measurements have been performed for each of the three structures of FIGS. 4A, 4B, and 4C in the context of the above numerical example. The following table indicates, in each of the three cases, for a SPAD-type photodiode with periodic patterns, the photon absorption in % in layer 10 when layer 10 has a 1.5-µm thickness, the photon absorption in % in layer 12 when layer 12 has a 1-nm thickness, and the percentage of reflected light.

|  | PAD-LESS | WITH PADS | WITH PADS AND SPACERS |
|---|---|---|---|
| Absorption (Si = 1.5 µm) | 8 | 8.6 | 9.2 |
| Absorption (Si = 1 µm) | 5.7 | 6.3 | 6.7 |
| Reflection | 6.8 | 4.1 | 1.5 |

Figure 5:
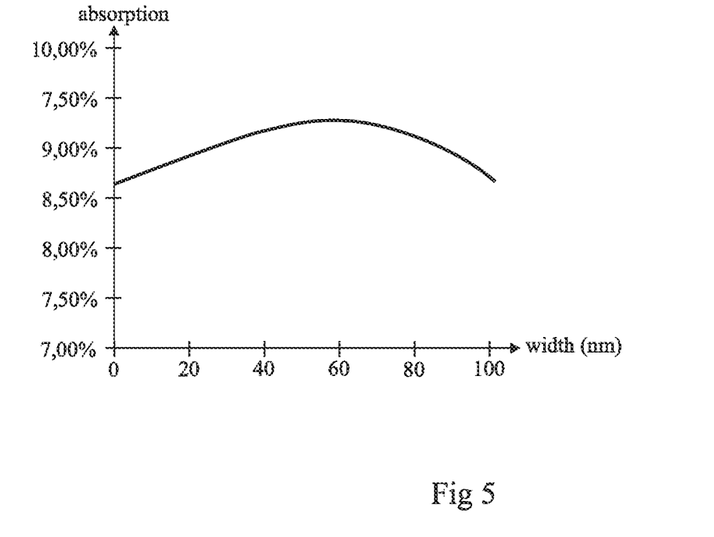
FIG. 5 is a curve showing the absorption of a photodiode of the type in FIGS. 3A and 3B or 4C according to the spacer width.

FIG. 5 is a curve illustrating the photon absorption in % in layer 10 for a photodiode provided with pads for various spacer width values. It can be seen that in the absence of spacers, such an absorption is in the order of 8.6% and that it increases up to a value greater than 9% for pad widths in the range between approximately 30 and approximately 90 nm, a maximum value being reached at approximately 9.3% for a spacer width in the order of 60 nm.

Figure 6:
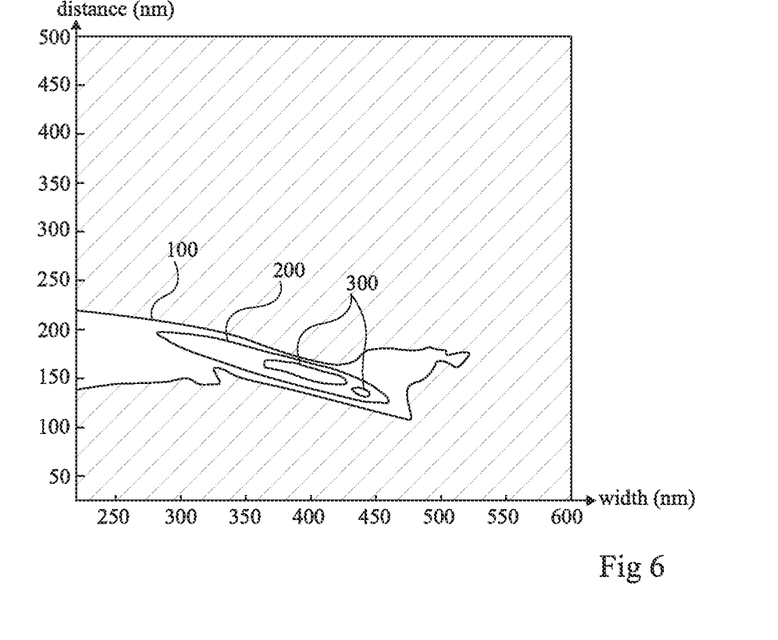
FIG. 6 shows the absorption gain in a photodiode of the type comprising pads and spacers compared with the case of a photodiode with pads and no spacers, for various values of parameters of pad width and distance between pads.

FIG. 6 shows that, according to the wavelength and to the various parameters of a structure, including the width of the spacers, the selection of the pad size and of the interval between pads is crucial to obtain the desired effect of improvement of the photon absorption. The chart of FIG. 6 is plotted for spacers having a 40-nm width, for an 850-nm wavelength, for a silicon-based photodiode, and for polysilicon pads bordered with silicon nitride spacers. The abscissas indicate lateral pad dimensions and the ordinates indicate distances between pads. Curve 100 defines an area inside of which the absorption with pads and spacers is greater than the absorption with pads and no spacers. Curve 200 defines an area inside of which the absorption with spacers is greater by 4% than the absorption with no spacers. Curve 300 defines an area inside of which the absorption with spacers is greater by 6% than the absorption with no spacers. Thus, in this specific case, it can be seen that the absorption gain induced by the spacers is maximum when the pad width ranges between approximately 350 and approximately 450 nm and when the space between pads is in the range between approximately 150 and approximately 180 nm.

Generally, it will be within the abilities of those skilled in the art to obtain the chart of FIG. 6 and to optimize the dimensions with conventional simulation methods, by using simulation programs such as software DiffractMOD (www.rsoftdesign.com) or software Grating Toolbox (www.lighttrans.com). Thus, provided to perform this previous simulation calculation, it will be within the abilities of those skilled in the art, with no trial and error, to form pads provided with spacers of suitable dimensions to increase the quantum efficiency or photon absorption of a photodiode.

Figure 7A:
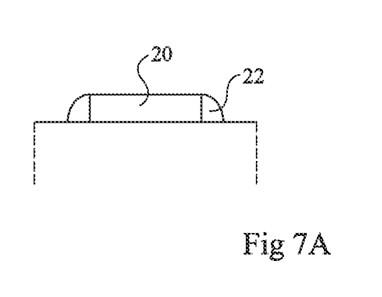
FIGS. 7A and 7B show examples of embodiments of pads arranged on photodiodes.
Figure 7B:
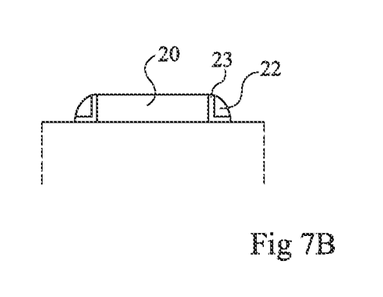

FIGS. 7A and 7B show practical examples of the forming of the previously-described pads provided with spacers. Indeed, it should be noted that a structure of photodiode type is generally associated, inside and on top of a same semiconductor substrate, with MOS transistors comprising gates having at least a portion made of polysilicon, such gates being provided with spacers, currently made of silicon nitride. Thus, as shown in FIG. 7A, a polysilicon pad 20 surrounded with silicon nitride spacers 22 may simply be used. According to a variation, illustrated in FIG. 7B, between a pad 20 and spacer 22 is provided a thin layer of intermediate material 23, as currently used in the forming of spacers for MOS transistors. As a result, the pads provided with spacers described herein may be manufactured with no modification to a conventional technological photodiode and CMOS transistor manufacturing process.

It should also be noted that the pads according to the invention may rest on a very thin insulator layer such as the gate insulator of MOS transistors, currently having a thickness in the order of a few nm only.

Figure 8:
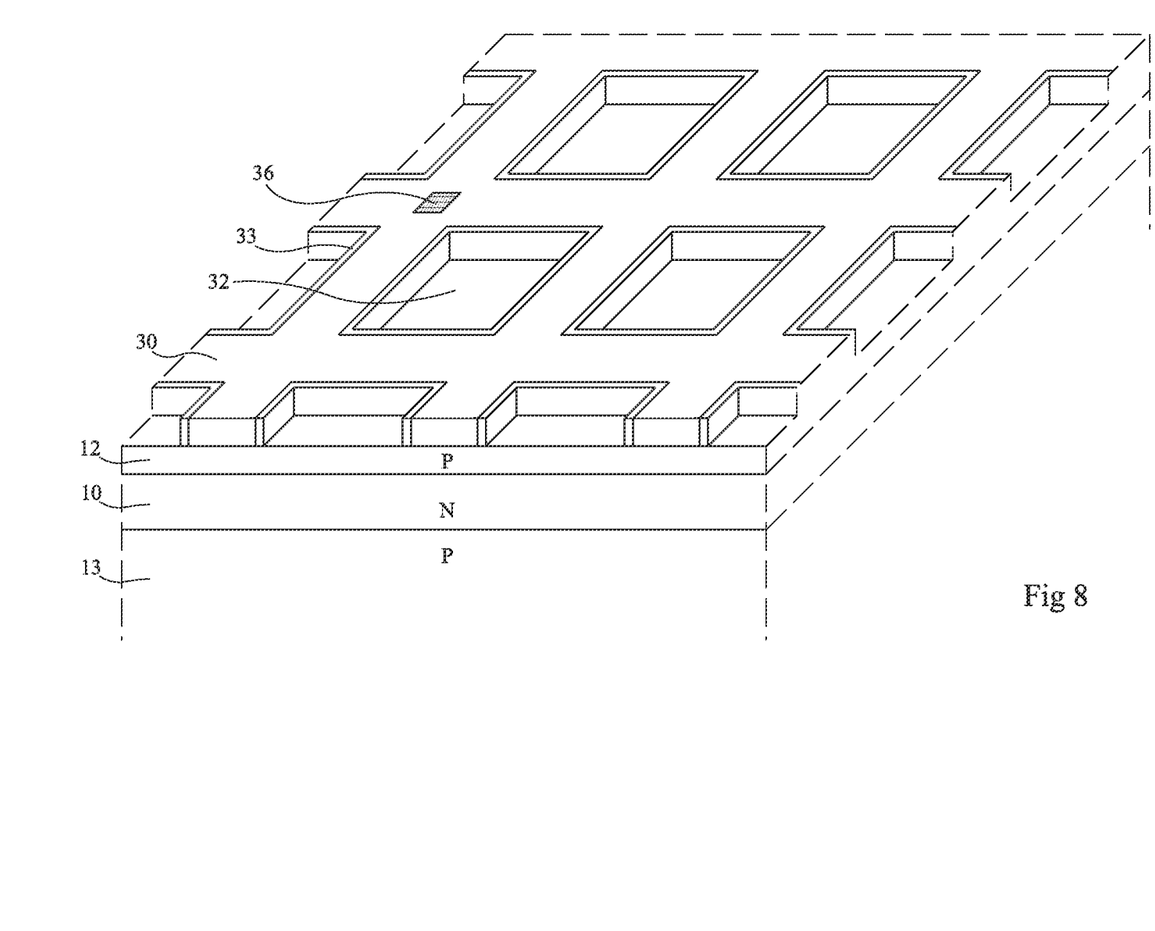
FIG. 8 shows, in perspective cross-section view, an embodiment of a SPAD-type photodiode.

FIG. 8 shows an embodiment of a SPAD-type photodiode. This photodiode comprises a substrate of the same type as that shown in FIG. 3A, that is, an N-type semiconductor layer 10 where photons are desired to be transformed into electron-hole pairs. Layer 10 is surrounded with layers 12 and 13 of the opposite conductivity type. Above layer 10 is formed a lattice complementary to the pad array shown in FIG. 3B. Such a lattice comprises interlaced strips 30 made of a first material delimiting therebetween recesses (openings) 32. Each of strips 30 is bordered with a spacer 33. Thus, the dimensions of recesses 32 correspond to the dimensions of central pads 20 of FIG. 3B. The relations between the indexes of the material of strips 30 and of the material of spacers 33 are the same as those discussed in relation with FIGS. 3A and 3B. Further, although this is not shown in FIG. 8 to simplify the representation, the structure, like that of FIG. 3A, is preferably coated with a protection layer having an index n3 lower that the index of the other elements of the structure. This protection layer fills the recesses 32.

According to an additional feature of the embodiment of FIG. 8, the lattice strips 30 are made of a conductive material, for example, made of doped polysilicon, of type N or type P according to the technologies used. At least one connection element 36 is provided on top of and in contact with at least a portion of strips 30 to enable to connect these strips to a bias voltage. Although connection element 36 is shown on the lattice of FIG. 8, such a connection element will preferably be provided on extensions of these strips outside of the useful area of the photodiode to avoid disturbing the operation thereof.

The fact of connecting strips 30, which form a transparent electrode, to a bias voltage enables to drive away the charge carriers which would tend to come close to the upper surface of the photodiode and to create a dark current by recombination.

Thus, strips 30 have the double function of improving the quantum efficiency of the diode and of decreasing its dark current.

The use of simulation programs such as those previously indicated shows that the structure of FIG. 8, substantially complementary to that of FIGS. 3A and 3B, still more advantageously increases the quantum efficiency of the underlying SPAD diode.

Figure 9:
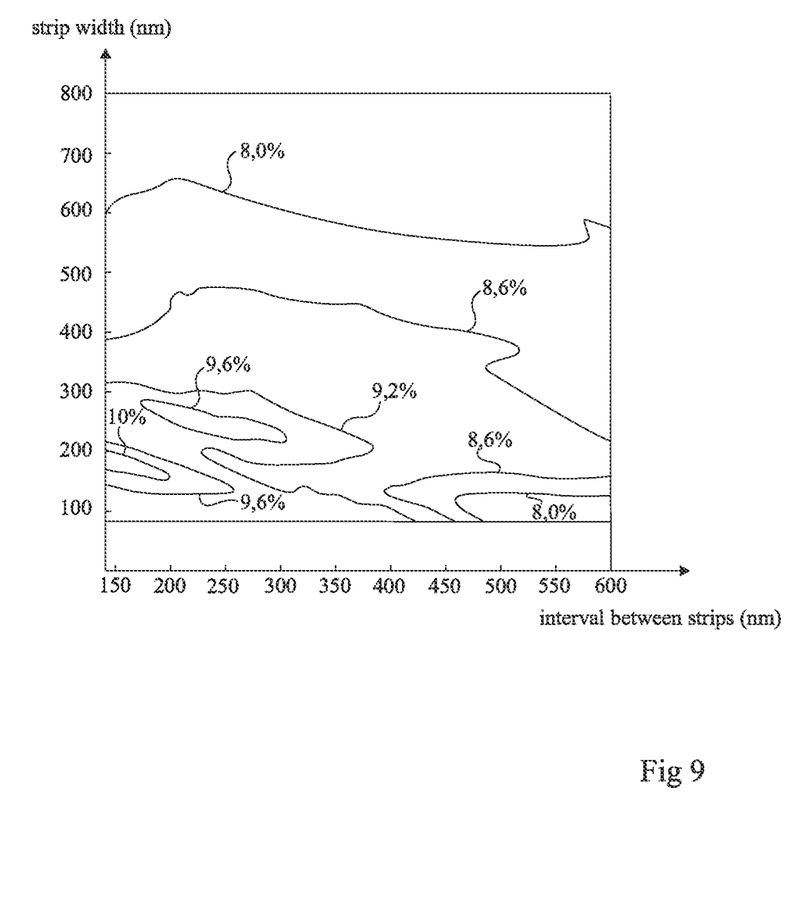
FIG. 9 is a chart illustrating the absorption in a lattice photodiode of the type in FIG. 8, for various lattice parameter values.

FIG. 9 is a chart illustrating the absorption in a lattice photodiode of the type in FIG. 8, for various lattice parameter values. FIG. 9 shows that, according to the wavelength and to the various parameters of the structure, the selection of the strip width (including the spacers) and of the interval between strips is crucial to obtain the desired improvement of the photon absorption.

The chart of FIG. 9 is plotted for spacers having a 40-nm width, for a 850-nm wavelength, for a silicon-based photodiode, and for polysilicon strips 30 bordered with spacers 33, recesses 32 being filled with silicon oxide. The abscissas indicate distances between strips of the lattice and the ordinates indicate lateral dimensions of strips (including the spacers).

In this drawing, areas where the absorption is respectively greater than 8.0%, 8.6%, 9.2%, 9.6%, and 10% have been indicated.

The area where the absorption is greater than 8.0% is located under the upper curve marked "8.0%" and above and to the left of the lower curve marked "8.0%". It should be noted that in this area, the absorption is greater than that of a photodiode with no pads and no spacers.

The area where the absorption is greater than 8.6% is located under the upper curve marked "8.6%" and above and to the left of the lower curve marked "8.6%". It should be noted that in this area, the absorption is greater than that of a photodiode with pads and no spacers.

The area where the absorption is greater than 9.2% is located within the curve marked "9.2%". It should be noted that in this area, the absorption is greater than that of a photodiode with pads and spacers, of the type shown in FIGS. 3A and 3B.

In two areas, marked "9.6%", the absorption is greater than 9.6%.

In an area marked "10%", the absorption is greater than or equal to 10%.

Thus, in this specific case, it can be seen that the absorption gain induced by the lattice structure is maximum when the strip width is in the range between approximately 180 and approximately 300 nm and the distance between strips is in the range between less than 150 and approximately 300 nm.

All the advantages and specificities discussed in relation with the example of FIGS. 3A and 3B apply to the embodiment of FIG. 8.

Of course, the present invention is likely to have various alterations, modifications, and improvements, especially as concerns the materials used, which may be any selected materials, provided for them to be transparent to the operating wavelength and to respect the previously-discussed relations between indexes n1, n2, n3 and index $n_{sc}$ of the photodiode semiconductor. If the technology leads to using other materials than polysilicon, silicon nitride, and silicon oxide, simulation programs such as those indicated previously will enable to determine the optimal dimensions and the pitch of the strips to be used, with no trial and error.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A SPAD-type photodiode, comprising:
a semiconductor substrate formed by a stack of three semiconductor layers of alternating conductivity type with an uppermost one of the three semiconductor layers having a light-receiving surface and a middle one of the three semiconductor layers configured to transform photons received at the light receiving surface to electron-hole pairs;
interlaced strips of a first material forming a lattice over said light receiving surface, said first material having a first optical index;
at least one spacer of a second material on lateral walls of said interlaced strips, said second material having a second optical index different from the first optical index;
wherein said lattice has a pitch of the order of a magnitude of an operating wavelength of the photodiode;
wherein the first and second materials are transparent to the operating wavelength; and
wherein the first material is conductive and is electrically coupled to an electrical connection node to bias the interlaced strips of the lattice to a common voltage level.

2. The photodiode of claim 1, wherein the first optical index (n1) is different from second optical index (n2), wherein n1 and n2 are both lower than or equal to a substrate optical index (nsc) of the semiconductor substrate.

3. The photodiode of claim 2, further comprising a protection layer covering the strips and spacers which is made of a third material having a third optical index lower than the first and second optical indices.

4. The photodiode of claim 3, wherein said protection layer fills recesses defined by said lattice and said spacers.

5. The photodiode of claim 1, wherein the first and second material are non-metallic.

6. The photodiode of claim 1, wherein each of the strips of the lattice has a width in the range from one tenth to one third of the operating wavelength of the photodiode.

7. The photodiode of claim 1, wherein the substrate is made of silicon, wherein the strips of the first material are made of doped polysilicon, and wherein the spacers are made of silicon nitride.

8. The photodiode of claim 3, wherein the protection layer is made of silicon oxide.

9. The photodiode of claim 1, wherein said electrical connection node comprises a bias voltage node configured to apply a bias voltage to said lattice.

10. The photodiode of claim 1, wherein said interlaced strips forming the lattice define a plurality of lattice openings, and wherein the spacer are provided on lateral walls of said lattice openings.

11. A photosensor, comprising:
a semiconductor substrate formed by a stack of three semiconductor layers of alternating conductivity type with an uppermost one of the three semiconductor layers having a light-receiving surface and a middle one of the three semiconductor layers configured to transform photons received at the light receiving surface to electron-hole pairs;
a lattice over said light receiving surface formed of a first material having a first optical index, and including a plurality of lattice openings defined by interlaced strips;
a spacer on sidewalls of the lattice openings formed of a second material having a second optical index; and
a bias voltage node coupled to said first material of the lattice for applying a bias voltage to said lattice, said first material being electrically conductive, so as to bias the interlaced strips of the lattice to a common voltage level.

12. The photosensor of claim 11, wherein the first optical index is less than or equal to a substrate optical index of the semiconductor substrate.

13. The photosensor of claim 11, wherein the second optical index is less than or equal to a substrate optical index of the semiconductor substrate.

14. The photosensor of claim 11, further comprising a protection layer covering the lattice and spacers which is made of a third material having a third optical index lower than the first and second optical indices.

15. The photosensor of claim 11, further comprising a SPAD at said light receiving surface.

16. A SPAD-type photodiode, comprising:
a semiconductor substrate including a photosensitive region;
interlaced strips of a first material forming a lattice over said semiconductor substrate, said first material having a first optical index, said interlaced strips defining a lattice opening over the photosensitive region;
at least one spacer of a second material on lateral walls of said interlaced strips at said lattice opening, said second material having a second optical index different from the first optical index;
wherein the interlaced strips forming said lattice have a pitch of the order of a magnitude of an operating wavelength of the photodiode;
wherein the first and second materials are transparent to the operating wavelength; and
wherein the first material is conductive and is electrically coupled to an electrical connection node to bias the interlaced strips of the lattice to a common voltage level.

17. The photodiode of claim 16, wherein the first optical index (n1) is different from second optical index (n2), wherein n1 and n2 are both lower than or equal to a substrate optical index (nsc) of the semiconductor substrate.

18. The photodiode of claim 17, further comprising a protection layer covering the strips and spacers which is made of a third material having a third optical index lower than the first and second optical indices and wherein said protection layer fills the lattic opening.

19. The photodiode of claim 18, wherein the protection layer is made of silicon oxide.

20. The photodiode of claim 16, wherein the substrate is made of silicon, wherein the strips of the first material are made of doped polysilicon, and wherein the spacers are made of silicon nitride.

* * * * *